United States Patent
Albinet

(10) Patent No.: US 10,840,931 B2
(45) Date of Patent: Nov. 17, 2020

(54) DIGITAL TO ANALOG AND ANALOG TO DIGITAL CONVERTER

(71) Applicant: NXP B.V., Eindhoven (NL)

(72) Inventor: Xavier Albinet, Roquefort les Pins (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/673,095

(22) Filed: Nov. 4, 2019

(65) Prior Publication Data

US 2020/0169264 A1    May 28, 2020

(30) Foreign Application Priority Data

Nov. 26, 2018   (EP) ..................................... 18306568

(51) Int. Cl.
    *H03M 1/06*     (2006.01)
    *H03M 1/66*     (2006.01)

(52) U.S. Cl.
    CPC ......... *H03M 1/0665* (2013.01); *H03M 1/667* (2013.01)

(58) Field of Classification Search
    CPC .... H03M 1/0665; H03M 1/667; H03M 1/802; H03M 1/804; H03M 1/66; H03M 1/747
    USPC .................................................. 341/150, 144
    See application file for complete search history.

(56) References Cited

U.S. PATENT DOCUMENTS

| | | | |
|---|---|---|---|
| 6,924,760 B1 | 8/2005 | McLeod | |
| 7,705,755 B2* | 4/2010 | Yang | H03M 1/109 |
| | | | 341/118 |
| 7,898,453 B2* | 3/2011 | Mathe | H03M 1/462 |
| | | | 341/155 |
| 9,118,343 B2* | 8/2015 | Schulz | H03M 3/322 |
| 9,319,033 B1* | 4/2016 | Jin | H03K 4/502 |
| 9,425,685 B2* | 8/2016 | Philip | H02M 3/07 |
| 10,461,767 B1* | 10/2019 | Farid | H03M 1/403 |
| 2007/0216563 A1 | 9/2007 | Wu et al. | |
| 2010/0245142 A1* | 9/2010 | Myles | H03M 1/0665 |
| | | | 341/133 |
| 2011/0273151 A1* | 11/2011 | Lesso | H02M 3/1582 |
| | | | 323/271 |

(Continued)

OTHER PUBLICATIONS

Suarez, Ricardo E. et al; "All-MOS Charge Distribution Analog-to-Digital Conversion Techniques—Part II"; IEEE Journal of Solid-State Circuits; 7 pages (Dec. 1975).

(Continued)

*Primary Examiner* — Jean B Jeanglaude

(57) ABSTRACT

A digital-to-analog converter (DAC) is described having a digital input, an analogue output, and two capacitors. The DAC has a controller. The controller is configured to generate a switching sequence including at least two switch cycles dependent on the input value received on the digital input. If the input value corresponds to an odd number, in a first switch cycle during a switch cycle first phase, the controller switchably couples a reference voltage to a first terminal and a ground voltage to a second terminal of one of the two capacitors, and switchably couples a ground voltage to a first terminal and the reference voltage to a second terminal of the other of the two capacitors. During a switch cycle second phase, the controller switchably couples a ground voltage to the first terminal and the analogue output to the second terminal of both capacitors.

15 Claims, 6 Drawing Sheets

(56) References Cited

U.S. PATENT DOCUMENTS

2016/0301403 A1* 10/2016 Cassagnes .......... H03F 3/45475

OTHER PUBLICATIONS

Weyten, L. et al; "Two-capacitor DAC with Compensative Switching"; Electronics Letters, vol. 31, No. 17; 3 pages (Aug. 17, 1995).
Chen, Poki et al., "Switching Schemes for Reducing Capacitor Mismatch Sensitivity of Quasi-Passive Cyclic DAC", IEEE Transactions on Circuits and Systems—II: Express Briefs, vol. 56, No. 1; IEEE, Piscataway, NJ, USA; 5 pages (Jan. 2009).
Lee, K.S. et al., "Switched-capacitator cyclic DAC with mismatch charge compensation", Electronic Letters, Jun. 24, 2010, pp. 902-903, vol. 46, No. 13, The Institution of Engineering and Technology, Stevenage, GB.
Rombouts, P. et al; "Capacitor Mismatch Compensation for the Quasi-Passive Switched-Capaitor DAC"; IEEE Transactions on Circuits and Sysems—I: Fundamendal Theory and Applications, vol. 45, No. 1; 4 pages (Jan. 1998).
Rombouts, P. et al; "Linearity Improvement for the Switched-capacitor DAC"; Electronics Letters, vol. 32, No. 4; 2 pages (Feb. 15, 1996).

* cited by examiner

DIGITAL TO ANALOG AND ANALOG TO DIGITAL CONVERTER

CROSS-REFERENCE TO RELATED APPLICATIONS

This application claims the priority under 35 U.S.C. § 119 of European patent application no. 18306568.9, filed Nov. 26, 2018 the contents of which are incorporated by reference herein.

FIELD

This disclosure relates to digital to analog converters and analog to digital converters

BACKGROUND

High accuracy for example 16 bit or more Digital-to-Analog Converter (DAC) and Analog-to-Digital Converters (ADC) may include a charge recycling scheme using capacitors. An example of a DAC with the simplest charge recycling scheme is the two-capacitor successive approximation DAC. This two-capacitor DAC is the most important module within a successive approximation analog to digital (ADC) architecture. Due to capacitance mismatch between two capacitors after fabrication the achievable DAC resolution (in bits) may be restricted and consequently the resolution of an ADC in which the DAC is incorporated may also be restricted. The error caused by device mismatch may reduce the accuracy of the DAC. For higher resolution DACs, this error may be reduced by using larger capacitors requiring more area for implementation.

SUMMARY

Various aspects of the disclosure are defined in the accompanying claims. In a first aspect there is provided a digital-to-analog converter comprising a digital input; an analogue output; two capacitors, each capacitor having a first terminal and a second terminal; and a controller coupled to the digital input and a clock input, wherein the controller is configured to generate a switching sequence comprising at least two switch cycles dependent on the input value received on the digital input and wherein if the input value corresponds to an odd number, the controller is configured to in a first switch cycle: during a switch cycle first phase: switchably couple a reference voltage to a first terminal and a ground voltage to a second terminal of one of the two capacitors, and switchably couple a ground voltage to a first terminal and the reference voltage to a second terminal of the other of the two capacitors, and during a switch cycle second phase: switchably couple a ground voltage to the first terminal and the analogue output to the second terminal of both capacitors.

In one or more embodiments, the switching sequence may further comprise a logic-one switch cycle wherein the controller is further configured to during a switch cycle first phase: switchably couple a reference voltage to a first terminal and a ground voltage to a second terminal of one of the two capacitors, and switchably couple a ground voltage to a second terminal of the other of the two capacitors.

In one or more embodiments, the switching sequence may further comprise a logic-zero switch cycle wherein the controller is further configured to: during a switch cycle first phase: switchably couple a ground voltage to a first terminal and a ground voltage to a second terminal of one of the two capacitors, and switchably couple a ground voltage to a second terminal of the other of the two capacitors.

In one or more embodiments, the switching sequence may further comprise a logic-minus-one switch cycle wherein the controller is further configured to: during a switch cycle first phase: switchably coupling a ground voltage to a first terminal and a reference voltage to a second terminal of one of the two capacitors, and switchably coupling a ground voltage to a second terminal of the other of the two capacitors.

In one or more embodiments, the controller may be configured to generate a logic-minus-one switch cycle followed by a logic-one switch cycle in response to the input value comprising a logic one followed by a logic zero.

In one or more embodiments, the controller may be configured to generate at least one logic-one switch cycle dependent on the input value.

In one or more embodiments, the controller may be configured to generate at least one logic-zero switch cycle dependent on the input value.

In one or more embodiments, the controller may be configured to configured during a switch cycle second phase to switchably couple a ground voltage to the first terminal and the analogue output to the second terminal of both capacitors.

In one or more embodiments, the controller may be configured during a switch cycle second phase to switchably couple a reference voltage to the second terminal and the analogue output to the first terminal of both capacitors.

In one or more embodiments, the digital-to-analog converter may comprise a switch network coupled to each terminal of the two capacitors wherein in the switch terminal is configured to switchably couple one of a ground terminal, a voltage reference terminal, and the analog output, to each capacitor terminal, wherein the controller comprises a control output coupled to the switch network.

In one or more embodiments, the number of switch sequences may be even for each digital input value.

In one or more embodiments of the digital-to-analog converter, the switching sequence may comprise N switch cycles for N-bit resolution if N is even and N+1 switch cycles if N is odd.

In one or more embodiments the controller may further comprises a clock input configured to receive a clock and wherein each switch cycle corresponds to one clock period.

Embodiments of the digital to analog converter may be included in a successive approximation analog-to-digital converter.

In a second aspect there is provided a method of digital to analog conversion for a digital-to-analog converter comprising: a digital input; an analogue output; and two capacitors, each capacitor having a first terminal and a second terminal, the method comprising generating a switching sequence comprising a number of switch cycles dependent on the input value received on the digital input and wherein if the input value corresponds to an odd number, and in a first switch cycle: during a switch cycle first phase: switchably coupling a reference voltage to a first terminal and a ground voltage to a second terminal of one of the two capacitors, and switchably coupling a ground voltage to a first terminal and the reference voltage to a second terminal of the other of the two capacitors, and during a switch cycle second phase: switchably coupling a ground voltage to the first terminal and the analogue output to the second terminal of both capacitors.

BRIEF DESCRIPTION OF THE DRAWINGS

In the figures and description like reference numerals refer to like features. Embodiments of are now described in detail, by way of example only, illustrated by the accompanying drawings in which.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

DETAILED DESCRIPTION OF EMBODIMENTS

Figure 1:
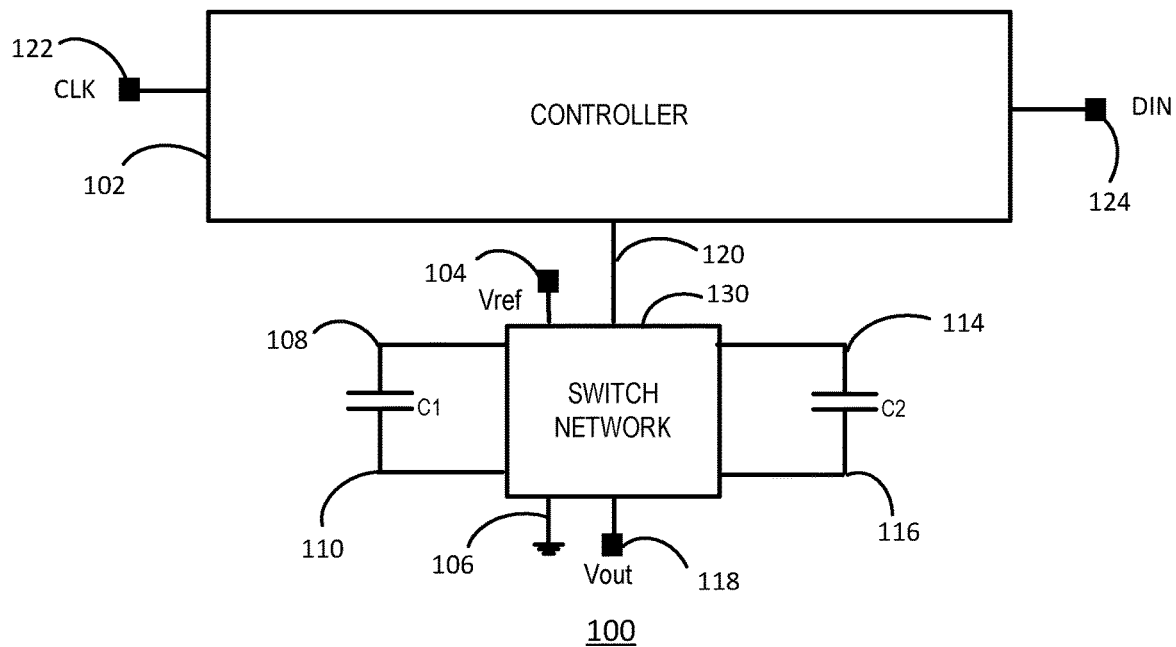
FIG. 1 shows a quasi-passive cyclic DAC according to an embodiment.

FIG. 1 shows a digital to analog converter 100 according to an embodiment. A switch network 130 may have a first output connected to a first terminal 108 of a capacitance C1. The switch network 130 may have a second output connected to a second terminal 110 of the capacitor C1. The switch network 130 may have a third output connected to a first terminal 114 of the capacitor C2. The switch network 130 may have a fourth output connected to a second terminal 116 of the capacitor C2. The switch network may have an analog output 118. The switch network 130 may have a supply input connected to a reference voltage supply rail 104. The switch network 130 may have a ground input connected to a ground supply rail 106. A controller 102 may have a clock input 122 and a digital data input 124 which may be a serial or parallel data input. The controller 102 may have a control output 120 connected to a control input of the switch network 122. The control output 120 may be a single connection or multiple connections.

In operation, the controller 102 may receive a digital input word on the data input 124. This may be received either serially or in parallel. For each received data word, the controller 102 may generate a switching sequence synchronised to a clock received on the clock input 122. The switching sequence includes a number of switching cycles, each switching cycle corresponding to a clock period. The term switching cycle and clock cycle may be considered as equivalent. The switching cycle may have two phases. In a first phase (φ1), one or both capacitors C1 and C2 may be charged by applying a reference voltage Vref via the switching network 122 to one of the respective terminals. Alternatively, in the first phase, one of the capacitors C1 and C2 may be discharged by applying a second reference voltage typically a ground to both of the respective terminals of C1 and C2. In a second phase (φ2) of each switching cycle, the charge present on both capacitors C1 and C2 may be transferred to the analog output (Vout) 118. The capacitors C1 and C2 may have the same nominal value.

The switching cycle may have one of four different modes dependent on the input word. The second phase (φ2) of each switch cycle may be the same in each of the four different modes except in the last switch cycle of a switching sequence where a modified second phase (φ2') may be used. In each of the four modes the connections of capacitors C1 and C2 as described may be interchanged, consequently the role of capacitor C1 and C2 in each switch cycle may be swapped.

In a modified-logic-zero (0') switch cycle first phase, the controller 102 may control the switch network 130 to connect Vref 104 to a first terminal 108 of capacitor C1 and the second terminal 116 of capacitor C2. The controller 102 may further control the switch network 130 to connect the ground 106 to the second terminal 110 of capacitor C1 and the first terminal 114 of capacitor C2. The effect of this is that the capacitors are effectively charged with opposite polarity so that during the second phase of the switch cycle, in the ideal case of the capacitor values being equal, the net charge is zero and so no charge is stored and the output voltage on the output 118 is zero.

In a logic-one (1) switch cycle first phase, the controller 102 may control the switch network 130 to connect Vref 104 to the first terminal 108 of capacitor C1 and the ground 106 to the second terminal 110 of capacitor C1. The controller 102 may control the switch network 130 to connect the ground 106 to the second terminal 116 of capacitor C2. The first terminal 114 of capacitor C2 may be open circuit so that capacitor C2 retains any charge transferred during previous switch cycles.

In a logic-minus-one (−1) switch cycle first phase, the controller 102 may control the switch network 130 to connect Vref 104 to the second terminal 110 of capacitor C1 and the ground 106 to the first terminal 108 of capacitor C1. The controller 102 may control the switch network 130 to connect the ground 106 to the second terminal 116 of capacitor C2. The first terminal 114 of capacitor C2 may be open circuit so that capacitor C2 retains any charge transferred during previous switch cycles.

In a logic-zero (0) switch cycle first phase, the controller 102 may control the switch network 130 to connect ground 106 to the first terminal 108 of capacitor C1 and the ground 106 to the second terminal 110 of capacitor C1. The controller 102 may control the switch network 130 to connect the ground 106 to the second terminal 116 of capacitor C2. The first terminal 114 of capacitor C2 may be open circuit so that capacitor C2 retains any charge transferred during previous switch cycles.

In the switch cycle second phase for each mode a first terminal 108 of capacitor C1 and first terminal 114 of capacitor C2 may be connected to ground 106 via switching network 122. The second terminal 110 of capacitor C1 and second terminal 116 of capacitor C2 may be connected to the output 118 via switching network 122.

For an N-bit resolution, the controller 102 will apply a predetermined sequence of N or N+1 switch cycles using a combination of some or all of the four modes dependent on the input data. If the input data word is an odd number, the controller may apply a first switch cycle of a modified-logic-zero before the rest of the switch sequence. Consequently, the number of clock cycles or switch cycles are always even for each input value. The inventor of the present disclosure has appreciated that by having an even number of conversion cycles, the error due to capacitance mismatch may be reduced. As illustrated and described the DAC 100 is a single ended DAC requiring two capacitors. However, it will be appreciated that in other examples, a differential DAC may be implemented using four capacitors and a switching network.

In general, the DAC 100 may generate a desired output voltage Vout=βVref, where for an N-bit DAC corresponding to a desired resolution of $2^N$, for an input value k, $\beta=k/2^N$.

As an example, for a 3-bit DAC with k=3 corresponding to logic "011", the serial digital input (least-significant-bit first) is "110". The controller 102 may add a 0' first giving a switch sequence of "0' 110". For some input values k, if k includes a logic sequence containing a "10", the controller 102 may substitute a sequence "−11" to improve the accuracy. The controller 102 may swap the role of capacitor C1 and capacitor C2 to improve the accuracy. The optimum switch sequence for each value of k for a desired resolution N may be predetermined by a-priori analysis.

Figure 2:
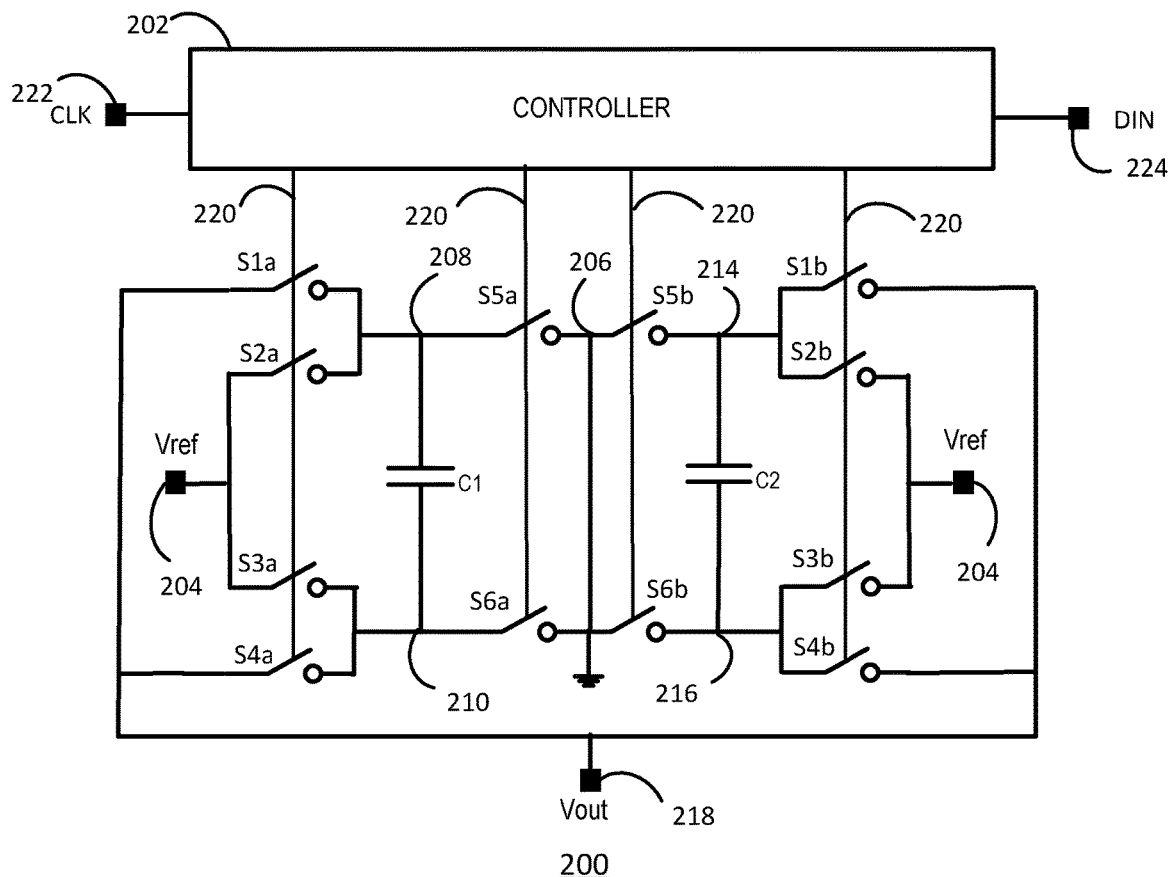
FIG. 2 illustrates a quasi-passive cyclic DAC according to an embodiment.

FIG. 2 shows a digital to analog converter 200 according to an embodiment. A controller 202 may have a clock input 222. The controller 202 may have a digital data input 224 which may be a serial data input or a parallel data input. The controller 202 may have a control output 220 which may be parallel output for independently controlling a number of switches. The digital to analog converter 200 includes a number of switches in a switching network S1a to S6a and S1b to S6b. The switches S1a to S6a and S1b to S6b may be implemented for example by transistors such as MOS transistors.

Switch S1a may have a first terminal connected to a first terminal 208 of capacitor C1. The switch S1a may have a second terminal connected to a DAC output 218. The switch S1a may have a control terminal connected to the control output 220.

Switch S2a may have a first terminal connected to a first terminal 208 of capacitor C1. The switch S2a may have a second terminal connected to a reference voltage (Vref) supply terminal 204. The switch S2a may have a control terminal connected to the control output 220.

Switch S3a may have a first terminal connected to a second terminal 210 of capacitor C1. The switch S3a may have a second terminal connected to a reference voltage (Vref) supply terminal 204. The switch S3a may have a control terminal connected to the control output 220.

Switch S4a may have a first terminal connected to a second terminal 210 of capacitor C1. The switch S4a may have a second terminal connected to the DAC output 218. The switch S4a may have a control terminal connected to the control output 220.

Switch S5a may have a first terminal connected to the first terminal 208 of capacitor C1. The switch S5a may have a second terminal connected to the ground terminal 206. The switch S5a may have a control terminal connected to the control output 220.

Switch S6a may have a first terminal connected to the second terminal 210 of capacitor C1. The switch S6a may have a second terminal connected to the ground terminal 206. The switch S6a may have a control terminal connected to the control output 220.

Switch S1b may have a first terminal connected to a first terminal 214 of capacitor C2. The switch S1b may have a second terminal connected to a DAC output 218. The switch S1b may have a control terminal connected to the control output 220.

Switch S2b may have a first terminal connected to a first terminal 214 of capacitor C2. The switch S2b may have a second terminal connected to a reference voltage (Vref) supply terminal 204. The switch S2b may have a control terminal connected to the control output 220.

Switch S3b may have a first terminal connected to a second terminal 216 of capacitor C2. The switch S3b may have a second terminal connected to a reference voltage (Vref) supply terminal 204. The switch S3b may have a control terminal connected to the control output 220.

Switch S4b may have a first terminal connected to a second terminal 216 of capacitor C2. The switch S4b may have a second terminal connected to the DAC output 218. The switch S4b may have a control terminal connected to the control output 220.

Switch S5b may have a first terminal connected to the first terminal 214 of capacitor C2. The switch S5b may have a second terminal connected to the ground terminal 206. The switch S5b may have a control terminal connected to the control output 220.

Switch S6b may have a first terminal connected to the second terminal 216 of capacitor C2. The switch S6b may have a second terminal connected to the ground terminal 206. The switch S6b may have a control terminal connected to the control output 220.

The switching cycle may have one of four different switch cycle modes dependent on the input data value k received on digital data input 224. These four different switch cycle modes as previously described for digital to analog converter 100 are modified-logic-zero (0'), logic-one (1), logic-minus-one (−1) and logic-one (1). The second phase of each switch cycle is the same in each of the four different modes. In each of the four modes the connections of capacitors C1 and C2 as described may be interchanged, consequently the role of capacitor C1 and C2 in each switch cycle may be swapped.

Figure 3A:
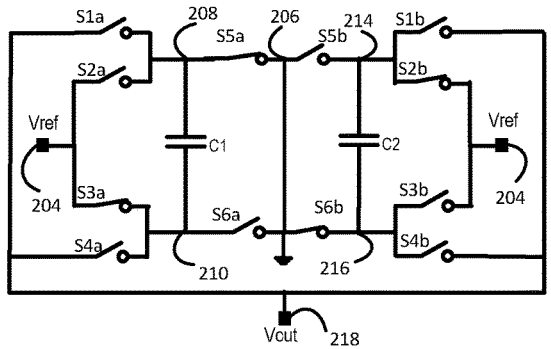
FIG. 3A shows the operation of the quasi-cyclic DAC of FIG. 2 to provide a modified-logic-zero in a first phase of a switching cycle.
Figure 3B:
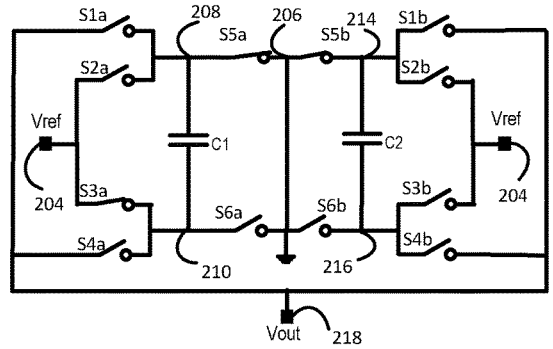
FIG. 3B shows the operation of quasi-cyclic DAC of FIG. 2 to provide a logic-one in a first phase of a switching cycle.
Figure 3C:
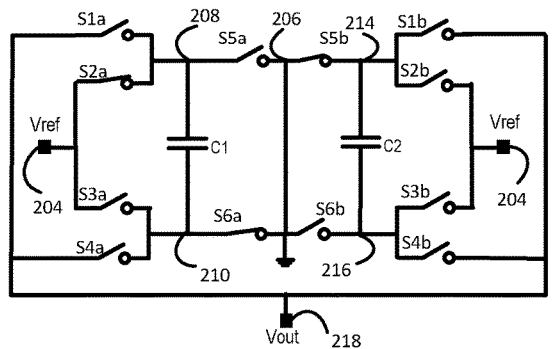
FIG. 3C shows the operation of quasi-cyclic DAC of FIG. 2 to provide a logic-minus-one in a first phase of a switching cycle.
Figure 3D:
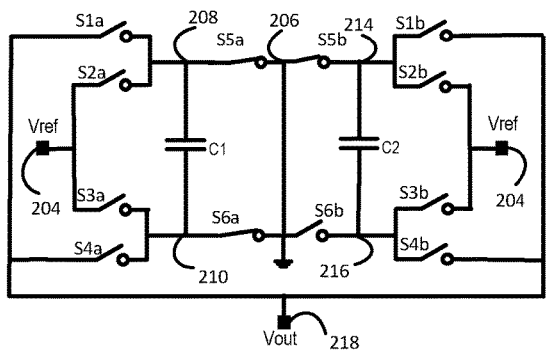
FIG. 3D shows the operation of quasi-cyclic DAC of FIG. 2 to provide a logic-zero in a first phase of a switching cycle.
Figure 3E:
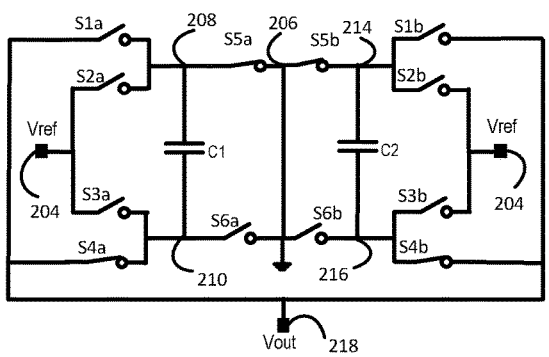
FIGS. 3E and 3F show the operation of quasi-cyclic DAC of FIG. 2 in a second phase of a switching cycle.

The state of the switches in the different phases of each switch cycle are illustrated in FIGS. 3A, 3B, 3C, 3D, and 3E. FIG. 3A illustrates an example of the states of the switches S1a to S6a and S1b to S6b in a first phase (φ1) of a switch cycle if a modified-logic-zero is required. FIG. 3B illustrates an example of the states of the switches S1a to S6a and S1b to S6b in a first phase of a switch cycle if a logic-one is required. FIG. 3C illustrates an example of the states of the switches S1a to S6a and S1b to S6b in a first phase of a switch cycle if a logic-minus-one is required. FIG. 3D illustrates an example of the states of the switches S1a to S6a and S1b to S6b in a first phase of a switch cycle if a logic-zero is required. FIG. 3E illustrates an example of the states of the switches S1a to S6a and S1b to S6b in a second phase (φ2) of a switch cycle for all four switch cycle modes. The switch states of each switch for the two phases of each switch cycle as illustrated in FIGS. 3A, 3B, 3C, 3D and 3E are shown in table 1 below.

nised to a clock received on the clock input 222. The switching sequence includes a number of switching cycles, each switching cycle corresponding to a clock period.

For each data word k, the controller may generate a serial digital sequence LSB first. If the value of k is odd, the controller 202 may add a 0' switching cycle first. Subsequently, the controller may apply the predetermined switching cycles for each value of k.

The two capacitors C1 and C2 may be connected to ground 206 during last charge distribution. The output voltage Vout at the end of the switching sequence is Vout=βVref, where for a N-bit DAC corresponding to a

TABLE 1

| Switch | Mode | | | | | |
|---|---|---|---|---|---|---|
| | 0' (φ1) +Vref on C1, −Vref on C2 | 1(φ1) +Vref on C1 keep charge on C2 | −1(φ1) −Vref on C1, keep charge on C2 | 0(φ1) 0 volts on C1, keep charge on C2 | φ2 Charge on C1, C2 transferred to DAC output | φ2' Capacitance C1, C2 inverted and connected to DAC output |
| S1a | open | open | open | open | open | closed |
| S2a | open | open | closed | open | open | open |
| S3a | closed | closed | open | open | open | closed |
| S4a | open | open | open | open | closed | open |
| S5a | closed | closed | open | closed | closed | open |
| S6a | open | open | closed | closed | open | open |
| S1b | open | open | open | open | open | closed |
| S2b | closed | open | open | open | open | open |
| S3b | open | open | open | open | open | closed |
| S4b | open | open | open | open | closed | open |
| S5b | open | closed | closed | closed | closed | open |
| S6b | closed | open | open | open | open | open |

As will be appreciated the role of capacitors C1 and C2 may be swapped for each of the switch cycles. Table 2 illustrates the corresponding switch states for each states of the switches S1a to S6a and S1b to S6b where the role of C1 and C2 are opposite to the switch states listed in table 1.

desired resolution of $2^N$, for an input value k, $\beta=k/2^N$. In other examples, the controller 202 may provide Vout=β' Vref with β'=1−β and for the last switch cycle phase 2 charge distribution invert the two capacitors C1 and C2 and connect to Vref during=>1−β=β'. In this case the controller 202 may

TABLE 2

| Switch | Mode | | | | | |
|---|---|---|---|---|---|---|
| | 0' (φ1) +Vref on C2, −Vref on C1 | 1 (φ1) +Vref on C2 keep charge on C1 | −1 (φ1) −Vref on C2, keep charge on C1 | 0 (φ1) 0 volts on C2, keep charge on C1 | φ2 Charge on C1, C2 transferred to DAC output | φ 2' Capacitance C1, C2 inverted and connected to DAC output |
| S1a | open | open | open | open | open | closed |
| S2a | closed | open | open | open | open | open |
| S3a | open | open | open | open | open | closed |
| S4a | open | open | open | open | closed | open |
| S5a | open | closed | closed | closed | closed | open |
| S6a | closed | open | open | open | open | open |
| S1b | open | open | open | open | open | closed |
| S2b | open | open | closed | open | open | open |
| S3b | closed | closed | open | open | open | closed |
| S4b | open | open | open | open | closed | open |
| S5b | closed | closed | open | closed | closed | open |
| S6b | open | open | closed | closed | open | open |

As will be apparent, switches S1a and S1b are not used in either table 1 or table 2 so in some examples these may be omitted. In other examples the switches S1a and S1b may be used instead of switches S4a and S4b and the function of switches S5a, S6a, S5b and S6b may be reversed.

Figure 3F:
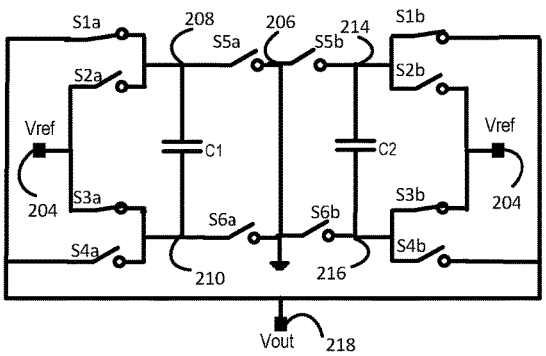

In operation, the controller 202 may receive a digital input word k on the data input 224. This may be received either serially or in parallel. For each received data word, the controller may generate a switching sequence synchrocontrol switches as illustrated in FIG. 3F for a modified second phase (φ2'). The switches that are on i.e. closed for the modified second phase are S1a, S1b, S3a and S3b.

Figure 4A:
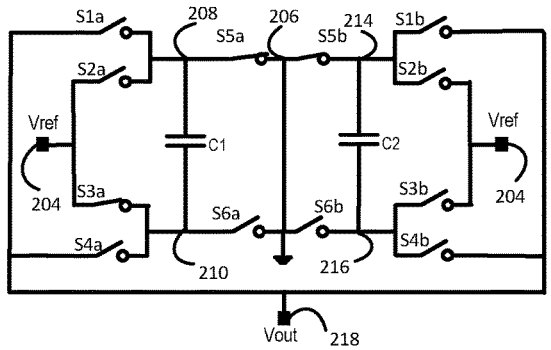
FIG. 4A shows the operation of a quasi-cyclic DAC to provide an output voltage of half the reference voltage in a first phase.
Figure 4B:
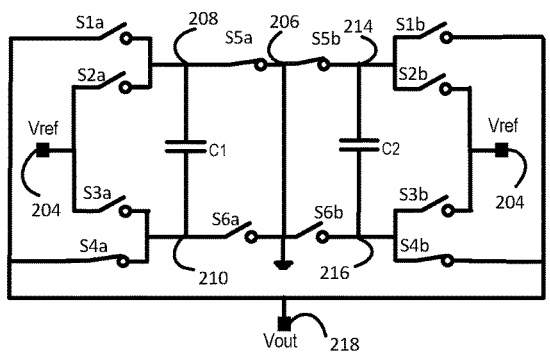
FIG. 4B shows the operation of a quasi-cyclic DAC to provide an output voltage of half the reference voltage in a second phase.

For an N-bit resolution, the controller 202 will apply a predetermined sequence of N or N+1 switch cycles using a combination of some or all of the four modes dependent on the input data. If the input data word is an odd number, the controller may apply a first switch cycle of a modified-logic-zero before the rest of the switch sequence. Consequently, the number of clock cycles or switch cycles are always even for each input value. The inventor of the present disclosure has appreciated that by having an even number of conversion cycles, the error due to capacitance mismatch may be reduced. This may be further understood with reference to FIGS. 4A and 4B. FIG. 4A shows a logic on switch cycle first phase. FIG. 4B shows a logic 1 switch cycle second phase. The sequence is conventionally used where a value of β=Vref/2 is required. Ideally the capacitances C1 and C2 have exactly the same value. In reality, they will be different due to manufacturing variations.

Figure 5A:
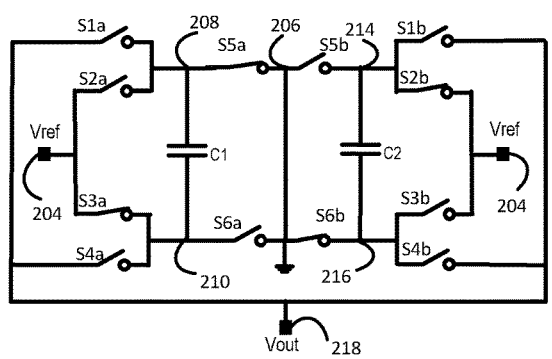
FIG. 5A shows the operation of a quasi-cyclic DAC to provide an output voltage of half the reference voltage in a first phase of a first switching cycle.

Consider C1 has a real value of C(1−α) and C2 has a real value of C(1+α) where C is the average value of C1 and C2. During the first switching phase, C1 is charged to a value of Vref as shown in FIG. 5A and so has a charge Q=C(1−α) Vref. In the second switching phase shown in FIG. 5B, capacitors C1 and C2 are connected in parallel and to the DAC output 218. The charge Q is now given by $$Q = (C1 + C2).Vout$$
$$= (C(1 - \alpha) + C(1 + \alpha)).Vout$$
$$= 2CVout$$

$$2CVout = C(1 - \alpha)Vref$$

The gain β=Vout/Vref $$\beta = (1-\alpha)/2$$

In the ideal case β=½ so the error ε=−ε/2

Figure 5B:
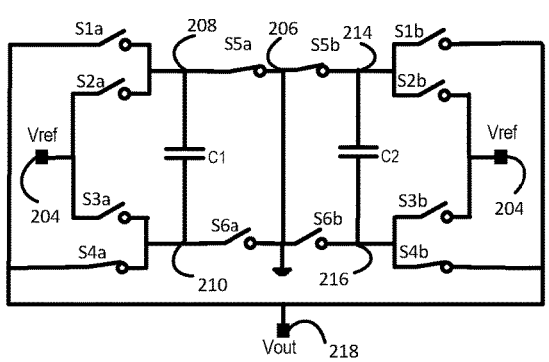
FIG. 5B shows the operation of a quasi-cyclic DAC to provide an output voltage of half the reference voltage in a second phase of a first switching cycle.
Figure 5C:
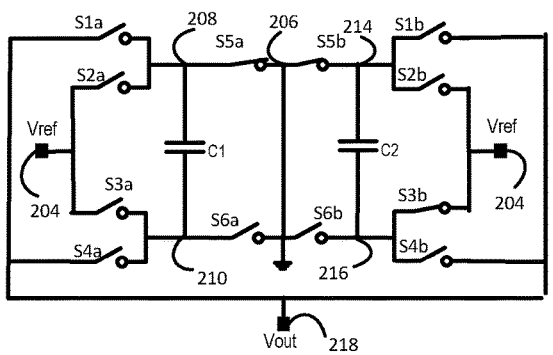
FIG. 5C shows the operation of a quasi-cyclic DAC to provide an output voltage of half the reference voltage in a first phase of a second switching cycle.
Figure 5D:
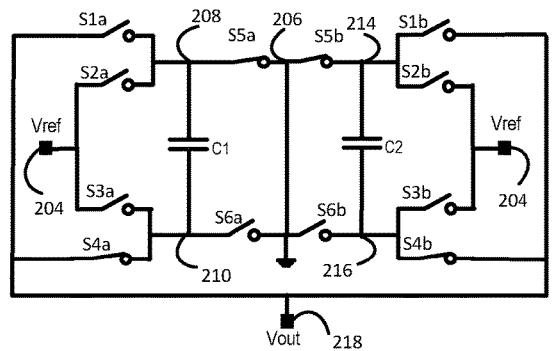
FIG. 5D shows the operation of a quasi-cyclic DAC to provide an output voltage of half the reference voltage in a second phase of a second switching cycle.

For DAC 200, the above case corresponds to a value of k being an odd number. In this case, the controller 200 generates the sequence illustrated in FIGS. 5A, 5B, 5C and 5D. FIG. 5A shows a "0'" cycle phase one, FIG. 5B shows a "0'" cycle phase two. FIG. 5C shows a "1" cycle phase one. FIG. 5D shows a "1" cycle phase two.

In FIG. 5A capacitor C1 may be pre-charged to Vref and capacitor C2 may be pre-charged to −Vref by having Vref applied to opposite terminals. In cycle "0" phase two, shown in FIG. 5B, the charge is shared on the output 218. In this case after the first switch cycle, the value of β is given by $$\beta = Vout/Vref = ((1-\alpha) - (1+\alpha))/2 = -\alpha$$

Turning to FIG. 5C, in switch cycle logic-one phase one, the controller may control the switches as indicated in table 2. Capacitor C2 is now pre-charged to Vref, and the charge on capacitor C1 is retained and has a value of −αVref.C(1−α). Following the charge redistribution in switch cycle logic-one phase two illustrated in FIG. 5D, the value of β is given by:

$$\beta = Vout/Vref = (-\alpha(1-\alpha) + (1+\alpha))/2 = (1+\alpha^2)/2$$

The switching sequence generated by the controller 202 reduces the error to ε=−α²/2 compared to ε=−α/2 for the conventional sequence. The sequence generated by the controller 202 in the DAC compensates for first-order errors due to capacitor mismatch which may remove the need for an amplifier at the DAC output 218.

If a digital input includes a 10, replacing a '10' switch sequence with a '−11' switch sequence results in the same DAC output code with different accuracy. The sequence may be chosen that gives the best accuracy.

In general, to get a desired value of Vout=βVref, a digital input value k may be applied as a serial digital input with least significant bit first. If the value of k is odd, then a switch cycle 0' first phase followed by a switch cycle second phase may be applied. Subsequently, the best switching scheme predetermined for a particular N-bit resolution may be applied which may include for a '10' input sequence selecting a '01' or '−11' switching sequence. The best switch sequence may also include swapping the role of C1 and C2 during the switch cycle first phase or pre-charge phase. In the last charge distribution both capacitors may have one terminal connected to ground and the other terminal connected to the output.

Alternatively rather than apply a sequence directly to determine Vout=βVref, an algorithm may be selected to generate a voltage Vout=β'Vref where β'=1−β. This corresponds to determining Vout for an input value of $2^N$−k. In this case, for the last charge distribution at the most significant bit, the capacitances C1, C2 are inverted resulting in the originally desired value of Vout. This inversion can be done for example by applying the alternative second phase connection denoted φ' in tables 1 and 2. Generating a voltage Vout from β'Vref may result in a reduced error compared to generating the switch sequence directly from k.

An example sequence for a 3-bit DAC implemented by DAC 200 is shown in table 3 below showing the predetermined sequence for capacitances C1 and C2, where the actual value of C2 is higher than C1. The conversion sequence indicates which capacitance is used for pre-charging to +Vref or 0 volts in the first phase of each switch cycle. For example, for sequence 0'100 the sequence C1, C2, C1, C2 indicates that C1 is pre-charged to +Vref in the first cycle, C2 is pre-charged to 0 v in the second cycle, C1 is pre-charged to +Vref in the third cycle and C2 is pre-charged to 0 v in the fourth cycle. It will be appreciated that for odd values of k, the first switch cycle is always a 0' switch cycle and the number of clock cycles required is always even.

TABLE 3

| k | $\beta i_k$ (Ideal β) | Sequence with minimum conversion error $e_k$ | Capacitance pre-charged each switch cycle | $\beta r_k$ (Real β) | $e_k = \beta r_k - \beta i_k$ | Clock cycles required |
|---|---|---|---|---|---|---|
| 1 | ⅛ | 100 => 0'100 | C1, C2, C1, C2 | $(1 - \alpha^4)/8$ | $-\alpha^4/8$ | 4 |
| 2 | ¼ | 10 | C1, C1 | $(1 - \alpha^2)/4$ | $-\alpha^4/8$ | 2 |
| 3 | ⅜ | 110 => 0'110 | C1, C1, C1, C1 | $⅜(1 - 2\alpha^2 - 4\alpha^3/3 - \alpha^4/3)/8$ | $-\alpha^2/4 - \alpha^3/2 - \alpha^4/8$ | 4 |
| 4 | ½ | 0'1 | C1, C2 | $(1 + \alpha^2)/2$ | $+\alpha^2/2$ | 2 |
| 5 | ⅝ | 101 => 0'-111 | C1, C1, C1, C2 | $(5 + 2\alpha^2 + \alpha^4)/8$ | $+\alpha^2/4 + \alpha^4/8$ | 4 |
| 6 | ¾ | 11 | C1, C2 | $(3 + \alpha^2)/4$ | $+\alpha^2/4$ | 2 |
| 7 | ⅞ | 111 => 0'111 | C1, C2, C2, C1 | $(7 + 2\alpha^2 - \alpha^4)/8$ | $+\alpha^2/4 - \alpha^4/8$ | 4 |

It will be appreciated that the choice of which capacitance is C1 and C2 is essentially arbitrary in table 3. The sequence illustrated is used as an indication as to whether the same capacitance is pre-charged or the alternate capacitance is pre-charged during each switch cycle in the sequence. For example for k=1, the capacitance pre-charged during each switch cycle could also be indicated as C2, C1, C2, C1 and for k=2 the capacitance pre-charged during each switch cycle could also be indicated as C2, C2.

For the example 3-bit DAC, a maximum of four clock periods are required to convert a digital input value. Generally, for n-Bits, the Error $\xi k=|\beta rk-\beta ik)|<1/2/2n$ for $k\in[0:2n]$ for integral non-linearity error (INL)±0.5 LSB. The DAC 200 may have a fast DAC conversion time of N clock periods or N±1 clock periods if k is an odd number for N-bit resolution without requiring an amplifier for first-order mismatch compensation.

Figure 6:
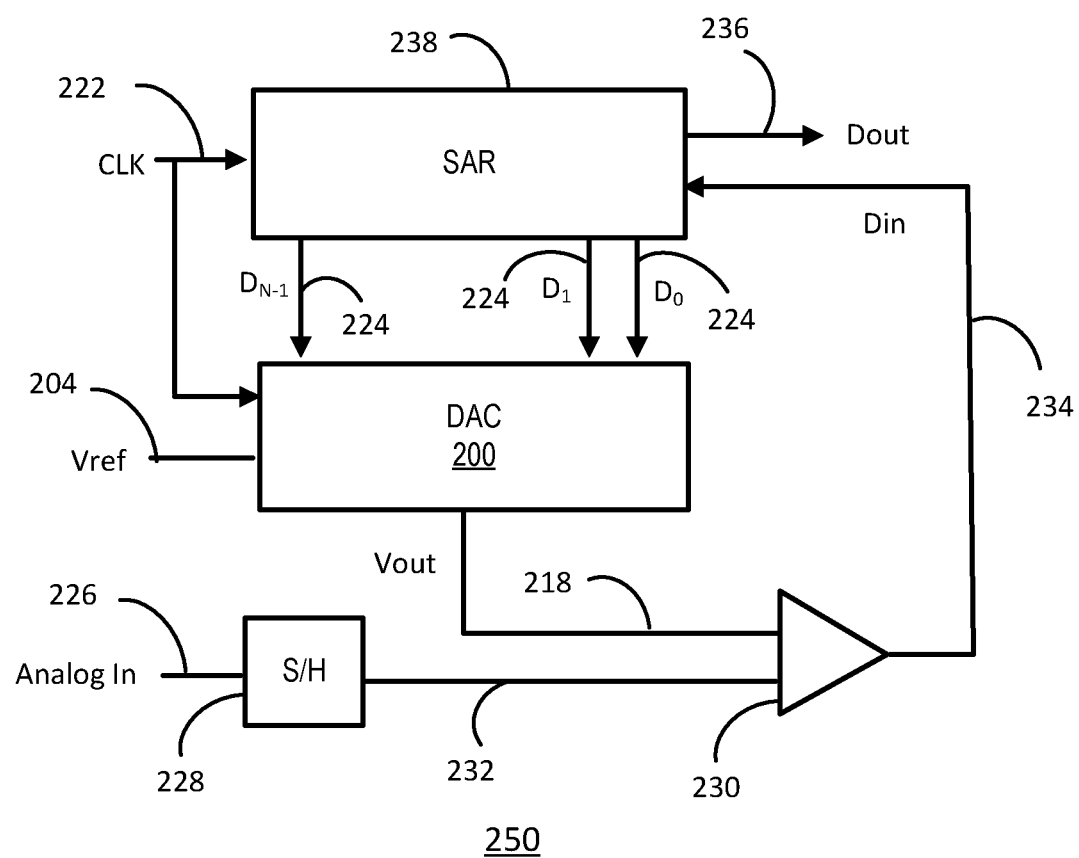
FIG. 6 shows a successive approximation analog to digital converter including a DAC according to an embodiment.

FIG. 6 shows a successive approximation analog-to-digital converter 250 including the digital to analog converter 200. In other examples it will be appreciated that digital to analog converter 100 may also be used. The analog-to-digital converter 250 may have a successive approximation register 238 having a clock input 222, a digital output 236 a serial digital input 234 and an intermediate digital output connected to the digital input 224 of the DAC 200. DAC output 218 may be connected to a first input of the comparator 230. The DAC 200 may have a reference voltage input 204. An analog input 226 may be connected to a sample and hold circuit 228. A sample and hold circuit output 232 may be connected to a second input of the comparator 230. A comparator output may be connected to the serial digital input 234.

DAC 250 requires only two capacitors in its single-ended architecture version irrespective of number of bits of resolution required while remaining a successive approximation type ADC. This is achieved by requiring multiple clock cycles per successive approximation step using circulating transfer of charge on these capacitors using cyclic DAC 200. This allows complexity, cost and area to be reduced.

In addition, this architecture corrects for nonlinearity errors due to mismatch using the switching scheme described herein without requiring an amplifier to correct for first order mismatch. This may allow smaller capacitors to be used, and without trimming. This may further decrease the area required to implement a successive approximation DAC.

The single-ended ADC 250 may be extended to a differential architecture allowing the same common mode voltage at the inputs of comparator 230 which relaxes comparator and DAC design complexity. Such a differential architecture would normally be considered prohibitively complex if a classical successive approximation structure was used.

Figure 7:
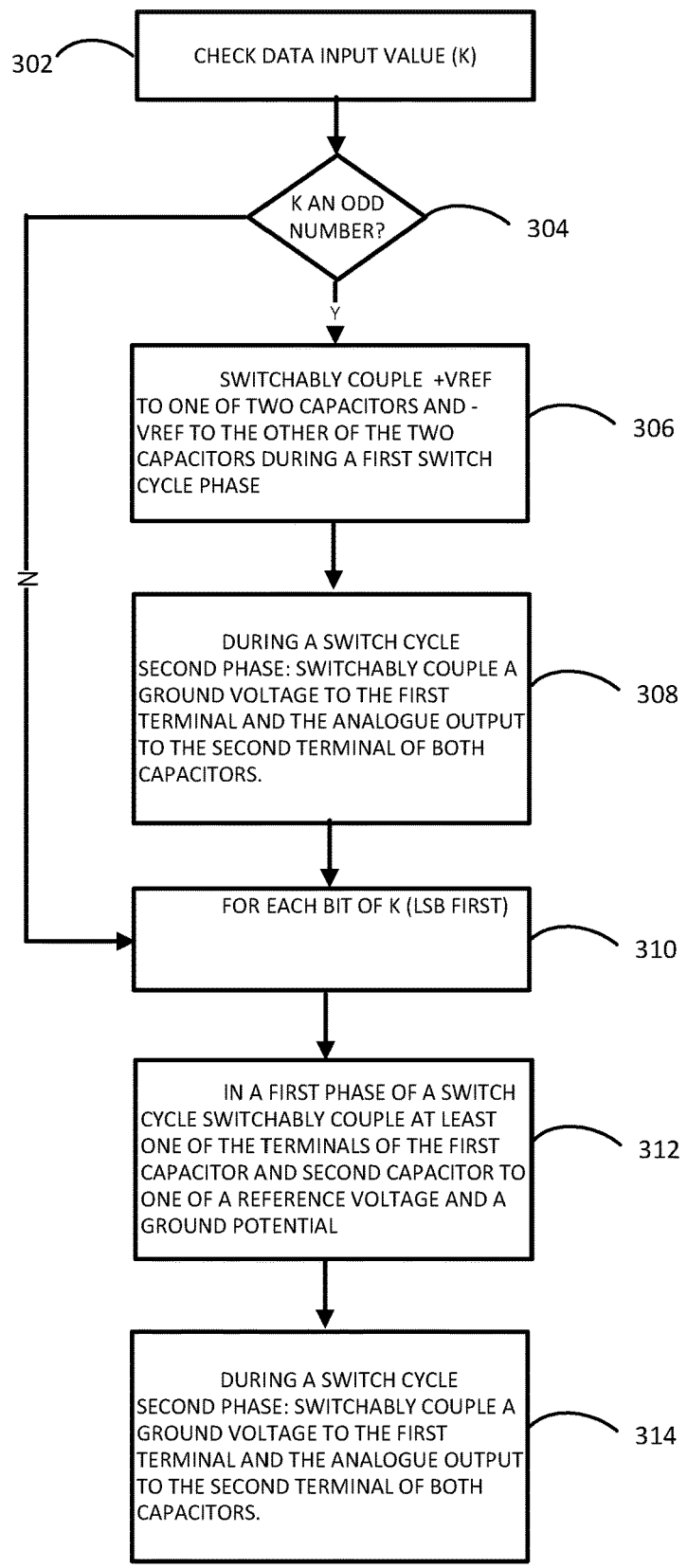
FIG. 7 illustrates a method of operation of a digital to analog converter according to an embodiment.

FIG. 7 illustrates a method of digital to analog conversion 300 for a cyclic digital to analog converter having two capacitors. In step 302 a digital data input value may be checked. In step 304, the method may check whether the data input value corresponds to an odd number. In step 304, the method may switchably couple a positive reference voltage (+Vref) to one of two capacitors and a negative reference voltage (-Vref) to the other of the two capacitors during a first switch cycle phase. In some examples this may be done by coupling the same voltage reference to opposite terminals of the capacitors. In step 308, during a switch cycle second phase, the method may switchably couple a ground voltage to a first terminal and the analogue output to a second terminal of both capacitors, so that the terminal of one of the capacitors connected to the voltage reference in the first phase is connected to ground in the second phase.

After step 308, the method moves onto step 310. Returning to step 304, if the input data value corresponds to an even number, the method progresses straight to step 310. In step 310, the method checks each bit of the input data starting with the least significant bit and generates a switch cycle. In step 312 in a first phase of a switch cycle, the method switchably couples at least one of the terminals of the first capacitor and second capacitor to one of a reference voltage and a ground potential. In step 314 during a switch cycle second phase, the method switchably couple a ground voltage to the first terminal and the analogue output to the second terminal of both capacitors.

The method 300 may generate an output voltage Vout on the analog output at the end of the switching sequence with a value of Vout=βVref, where for a N-bit DAC corresponding to a desired resolution of $2^N$, for an input value k, $\beta=k/2^N$.

Figure 8:
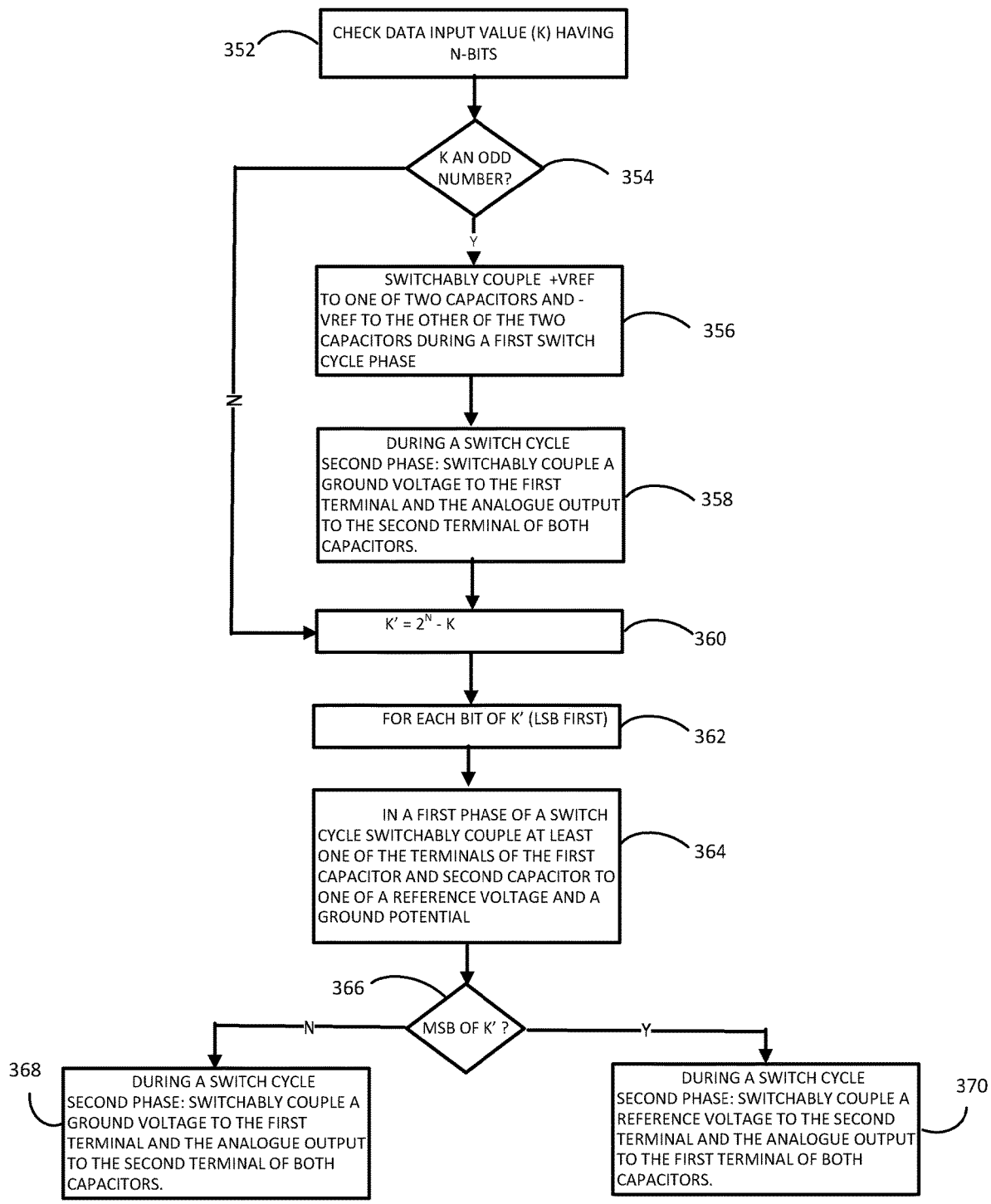
FIG. 8 illustrates a method of operation of a digital to analog converter according to an embodiment.

FIG. 8 illustrates a method of digital to analog conversion 350 for a cyclic digital to analog converter having two capacitors. In step 352 a digital data input value may be checked. In step 354, the method may check whether the data input value corresponds to an odd number. In step 356, the method may switchably couple a positive reference voltage (+Vref) to one of two capacitors and a negative reference voltage (-Vref) to the other of the two capacitors during a first switch cycle phase. In some examples this may be done by coupling the same voltage reference to opposite terminals of the capacitors. In step 358, during a switch cycle second phase, the method may switchably couple a ground voltage to a first terminal and the analogue output to a second terminal of both capacitors, so that the terminal of one of the capacitors connected to the voltage reference in the first phase is connected to ground in the second phase.

After step 358, the method moves onto step 360. Returning to step 354, if the input data value corresponds to an even number, the method progresses straight to step 360. In step 360 a value k' is generated where $k'=2^N-k$. Starting at step 362, the method serially generates a switch cycle for each bit of the modified input data k' starting with the least significant bit (LSB). In step 364 in a first phase of a switch cycle, the method switchably couples at least one of the terminals of the first capacitor and second capacitor to one of a reference voltage and a ground potential. In step 366, the method checks whether the current bit of the modified input value K' is the most significant bit (MSB). If the current bit is not the MSB then in step 368 during a switch cycle second phase, the method switchably couples a ground voltage to the first terminal and the analogue output to the second terminal of both capacitors. If the current bit is the MSB then in step 370 during a switch cycle second phase, the method switchably couples a reference voltage to the second terminal and the analogue output to the first terminal of both capacitors.

The method 350 initially determines Vout=β' Vref with β'=1-β and for the last switch cycle second phase in step 370 inverts the connections to the two capacitors C1 and C2. Consequently, the method 350 may generate output voltage Vout at the end of the switching sequence of Vout=βVref, where for a N-bit DAC corresponding to a desired resolution of $2^N$, for an input value k, $\beta=k/2^N$.

A digital-to-analog converter (DAC) is described having a digital input, an analogue output, and two capacitors. The DAC has a controller. The controller is configured to generate a switching sequence including at least two switch cycles dependent on the input value received on the digital input. If the input value corresponds to an odd number, in a first switch cycle during a switch cycle first phase, the controller switchably couples a reference voltage to a first terminal and a ground voltage to a second terminal of one of the two capacitors, and switchably couples a ground voltage to a first terminal and the reference voltage to a second terminal of the other of the two capacitors. during a switch cycle second phase, the controller switchably couples a ground voltage to the first terminal and the analogue output to the second terminal of both capacitors.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A digital-to-analog converter comprising:
a digital input; an analogue output; two capacitors, each capacitor having a first terminal and a second terminal; and
a controller coupled to the digital input and a clock input, wherein the controller is configured to generate a switching sequence comprising at least two switch cycles dependent on the input value received on the digital input and wherein if the input value corresponds to an odd number, the controller is configured to in a first switch cycle:
during a switch cycle first phase:
switchably couple a reference voltage to a first terminal and a ground voltage to a second terminal of one of the two capacitors, and switchably couple a ground voltage to a first terminal and the reference voltage to a second terminal of the other of the two capacitors, and
during a switch cycle second phase:
switchably couple a ground voltage to the first terminal and the analogue output to the second terminal of both capacitors.

2. The digital-to-analog converter of claim 1 wherein the switching sequence further comprises a logic-one switch cycle wherein the controller is further configured to
during a switch cycle first phase:
switchably couple a reference voltage to a first terminal and a ground voltage to a second terminal of one of the two capacitors, and switchably couple a ground voltage to a second terminal of the other of the two capacitors, and
during a switch cycle second phase:
switchably couple a ground voltage to the first terminal and the analogue output to the second terminal of both capacitors.

3. The digital-to-analog converter of claim 1 wherein the switching sequence further comprises a logic-zero switch cycle wherein the controller is further configured to:
during a switch cycle first phase:
switchably couple a ground voltage to a first terminal and a ground voltage to a second terminal of one of the two capacitors, and switchably couple a ground voltage to a second terminal of the other of the two capacitors.

4. The digital-to-analog converter of claim 1 wherein the switching sequence further comprises a logic-minus-one switch cycle wherein the controller is further configured to:
during a switch cycle first phase:
switchably couple a ground voltage to a first terminal and a reference voltage to a second terminal of one of the two capacitors, and switchably couple a ground voltage to a second terminal of the other of the two capacitors.

5. The digital-to-analog converter of claim 1 wherein the controller is configured to generate a logic-minus-one switch cycle followed by a logic-one switch cycle in response to the input value comprising a logic one followed by a logic zero.

6. The digital-to-analog converter of claim 1 wherein the controller is configured to generate at least one logic-one switch cycle dependent on the input value.

7. The digital-to-analog converter of claim 1 wherein the controller is configured to generate at least one logic-zero switch cycle dependent on the input value.

8. The digital-to-analog converter of claim 1 wherein the controller is configured during a switch cycle second phase to:
switchably couple a ground voltage to the first terminal and the analogue output to the second terminal of both capacitors.

9. The digital-to-analog converter of claim 1 wherein the controller is configured during a switch cycle second phase to:
switchably couple a reference voltage to the second terminal and the analogue output to the first terminal of both capacitors.

10. The digital-to-analog converter of claim 1 comprising a switch network coupled to each terminal of the two capacitors wherein in the switch terminal is configured to switchably couple one of a ground terminal, a voltage reference terminal, and the analog output, to each capacitor terminal, wherein the controller comprises a control output coupled to the switch network.

11. The digital-to-analog converter of claim 1 wherein the number of switch sequences is even.

12. The digital-to-analog converter of claim 1 wherein the switching sequence comprises N switch cycles for N-bit resolution if N is even and N+1 switch cycles if N is odd.

13. The digital to analog converter of claim 1 wherein the controller comprises a clock input configured to receive a clock and wherein each switch cycle corresponds to one clock period.

14. A successive approximation analog-to-digital converter comprising the digital to analog converter of claim 1.

15. A method of digital to analog conversion for a digital-to-analog converter comprising: a digital input; an analogue output; and two capacitors, each capacitor having a first terminal and a second terminal, the method comprising
generating a switching sequence comprising a number of switch cycles dependent on the input value received on the digital input and wherein if the input value corresponds to an odd number, in a first switch cycle:

during a switch cycle first phase:
   switchably coupling a reference voltage to a first terminal and a ground voltage to a second terminal of one of the two capacitors, and switchably coupling a ground voltage to a first terminal and the reference voltage to a second terminal of the other of the two capacitors, and
during a switch cycle second phase:
   switchably coupling a ground voltage to the first terminal and the analogue output to the second terminal of both capacitors.

* * * * *